United States Patent [19]

Leforestier et al.

[11] Patent Number: 5,021,688
[45] Date of Patent: Jun. 4, 1991

[54] TWO STAGE ADDRESS DECODER CIRCUIT FOR SEMICONDUCTOR MEMORIES

[75] Inventors: Sylvain Leforestier, Le Chenay; Dominique Omet, Evry, both of France

[73] Assignee: International Business Machines Corporation, Armonk, N.Y.

[21] Appl. No.: 417,362

[22] Filed: Oct. 5, 1989

[30] Foreign Application Priority Data

Oct. 28, 1988 [FR] France ............... 88 480068

[51] Int. Cl.[5] ............... H03K 19/086; H03K 17/16; H03K 19/092; H03K 19/003
[52] U.S. Cl. ............... 307/463; 307/455; 307/355; 365/189.02; 365/230.02
[58] Field of Search ............... 307/463, 449, 455, 450, 307/270, 443, 355; 365/177, 230.08, 189.08, 189.02, 230.02

[56] References Cited

U.S. PATENT DOCUMENTS

| | | | |
|---|---|---|---|
| 3,681,614 | 8/1972 | Kroos | 307/455 |
| 3,914,620 | 10/1975 | Millhollan et al. | 307/446 |
| 4,156,938 | 5/1979 | Proebsting et al. | 365/230.01 X |
| 4,237,387 | 12/1980 | Devendorf et al. | 307/455 |
| 4,551,639 | 11/1985 | Takeda et al. | 307/455 |
| 4,823,028 | 4/1989 | Lloyd | 307/455 X |
| 4,823,030 | 4/1989 | Wilhelm et al. | 307/455 |

OTHER PUBLICATIONS

IBM Technical Disclosure Bulletin, vol. 26, No. 7A, Dec. 1983, pp. 3503-3504.
IEEE Journal of Solid-State Circuits, vol. 23, No. 1, Feb. 1988, pp. 68-73.

Primary Examiner—Stanley D. Miller
Assistant Examiner—David R. Bertelson
Attorney, Agent, or Firm—Donald M. Boles

[57] ABSTRACT

A two stage address decoder circuit (AD) for 1/64 decode operation is disclosed which operates at high speed with low power consumption. Briefly stated, the circuit includes a first stage comprised of two predecoder circuits operable to develop predecoded output signals in response to input address signals and corresponding inverted address signals. Each predecoder circuit consists of a lower power high speed Differential Cascode Current Switch tree with its associated current source. The second or final decode stage is comprised of a plurality of final decoding circuits. Each final circuit consisting of a 2 way OR gate dynamically activated through a switched current source. The inputs of the 2 way OR gate are connected to one pair of the predecoded output signals. Final decoder circuits provide final decoded output signals which drive the word lines of a memory cell array. The switched current source is triggered by a control signal supplied by a clock generator (CG) so that the final decode circuits consume power only when the control signal is active.

16 Claims, 3 Drawing Sheets

TWO STAGE ADDRESS DECODER CIRCUIT FOR SEMICONDUCTOR MEMORIES

FIELD OF THE INVENTION

The present invention relates to semiconductor integrated circuits and more particularly to a two stage address decoder circuit for high speed large capacity Static Random Access Memories (SRAMs).

BACKGROUND OF THE INVENTION

In a semiconductor memory such as a SRAM, a word address decoder circuit is provided which generates select/unselect signals for appropriately selecting a plurality of memory cells in the same row of a memory cell array (e.g., those cells which are connected to the same word line), all while the remaining cells remain unselected. The address decoder circuit receives word address signals, in true and complement form, (e.g. n bits;) and generates one select signal among $2^n$ combinations of the address signals.

High speed and large capacity SRAMs play a key role in the development of modern high performance computer systems. To achieve this goal, BICMOS circuits which merge bipolar and CMOS technology are highly desirable to provide both bipolar and CMOS devices with the best performance/cost trade off.

As far as address decoder circuits are concerned, the present tendency is to combine a high speed low power multistage bipolar address decoder circuit with a CMOS or BICMOS driver in order to drive the heavy capacitive loads on the word lines of the memory array, typically comprised of CMOS 6-device SRAM cells.

It is well known that Current Mode Logic (CML) technology provides an extensive family of logic circuits, and in particular address decoder circuits with high speed operation at moderately low power levels. This is also true for its various derivatives or variants: e.g. Differential Cascode Current Switch (DCCS) logic, Emitter Coupled Logic (ECL), etc. With respect to DCCS logic, one may refer to the article: "Generation of multiple single-phase outputs from a single DCCS decode circuit" by M. E. Cohen et al, published in IBM Technical Disclosure Bulletin, Vol. 26, No. 7A, December 1983, pp 3503-3504.

A good example of such a multistage bipolar address decoder in CML technology is given in the article: "BICMOS circuit technology for a high speed SRAM", by T. Douseki et al published in the IEEE Journal of Solid State Circuits, Vol. 23, No. 1, Feb. 88, pp 68-73.

This article shows a way to design a bipolar address decoder circuit for a BICMOS memory. The decoder circuit may be understood as being composed of three circuit stages connected in cascade: a predecoding circuit of the ECL collector dotting type (CD), a level shifting circuit of the standard emitter follower type (EF), and a main decoding circuit called a series gate circuit (SG) in CML technology.

The CD circuit is used as the first layer of decoding. According to the CD circuit, it is not necessary to explicitly generate the true and complement address signals because the address receiver is included in the pre-decoder. However, this is not a definite advantage. True and complement address signals are generally available in a current switch environment. Alternatively, it is also possible to replace the complement address signals by a fixed reference voltage if supply and signal voltages are adequate.

For each address signal, a receiver of the current switch type generates current information corresponding to true and complement values. Therefore, instead of using a voltage, a current provides the pre-decoding information. The collectors are all dotted together and a decoded address will correspond to no current flow in any of them. The main disadvantage or drawback of this solution is that a kind of current mirror must be used in the CD circuit and this can lead to poor control on "low" voltage which corresponds to non-selection. A second drawback resides in the fact that the input capacitance of the CD circuit will be very high since transistors must be connected in parallel to provide the currents representative of a true/complement address which of course increases the number of transistors used in the circuit implementation.

The purpose of the emitter follower (EF) circuit is to generate pre-decoded signals with a number of Vbe DC shifts (depending on the number of diodes) in order to drive the series gate (SG) circuit that follows so that it operates as a level converter. This construction has some inconveniences, because it does not provide an efficient solution in optimizing the SG circuit.

The third decoding layer consists of a series gate circuit. Because the signals that drive the series gate circuit have already been predecoded by the collector dotting circuit, a differential tree where more than 2 transistors are connected in each branch can be used. Although this construction reduces the number of layers in the tree, it has a significant drawback in that the common emitter nodes are more heavily loaded, which in turn, results in slowing down current switching. In addition, it is clear that the up or "high" level depends on Vcc (minus a number of Vbe's), while the down or "low" level is referenced to ground. Finally, the saturation control of the series gate circuit is poor, and becomes even more acute when supply voltages are reduced.

All these circuits are biased between a positive supply voltage (VCC=0V) and a negative supply voltage (VEE=−5.2V) and all use standard current sources connected to VEE.

Seen as a whole, the disclosed three stage address decoder is power consuming in that there is no means provided to cut down the DC power in any stage of the decoder. This therefore causes a continuous consumption of power in the quiescent state, even if the circuits are not selected. Secondly, it has a limited flexibility and adaptability to different memory sizes and organizations because of the close interrelationships existing between the three circuits which in turn, makes it difficult to increase the number of tree levels. Further, there is a risk the output transistors of the series gate circuit saturating which leads to slower switching.

OBJECT OF THE INVENTION

It is an object of the present invention to provide a high speed low power two stage address decoder with no DC power consumption in the quiescent state in at least one of the two stages, and which therefore limits overall circuit power consumption.

It is another object of the present invention to provide a high speed low power two stage address decoder with an architecture having high flexibility and modularity in order to allow different configurations to be easily realizable irrespective of memory size and organization.

It is still another object of the present invention to provide a high speed low power two stage address decoder wherein there is a means in the current source to avoid saturation of the output transistors and to therefore increase the speed.

It is also an object of the present invention to provide a high speed low power two stage address decoder circuit having a simplified circuit arrangement which requires a reduced number of devices.

These and others objects of the present invention are accomplished by a two stage address decoder circuit including; a first stage comprised of at least two predecoder circuits operable to develop predecoded output signals in response to input address signals and the corresponding inverted address signals. Each predecoder circuit consists of a low power high speed Differential Cascode Current Switch tree (DCCS) with its associated current source. The address decoder circuit further includes a second or final decoding stage comprised of a plurality of final decoder circuits (FD). Each final decoder circuit consists of a 2-way OR gate dynamically activated through a switched current source. The inputs of the 2-way OR gate are connected to one pair of the predecoded output signals. Final decoder circuits supply final decoded output signals to drive the word lines of a memory cell array. The switched current source is triggered by a control signal supplied by a clock generator so that the final decoder circuits consume power only when the control signal is active.

DESCRIPTION OF THE DRAWINGS

Reference may be now had to the drawings in which.

DETAILED DESCRIPTION OF THE INVENTION

Figure 1:
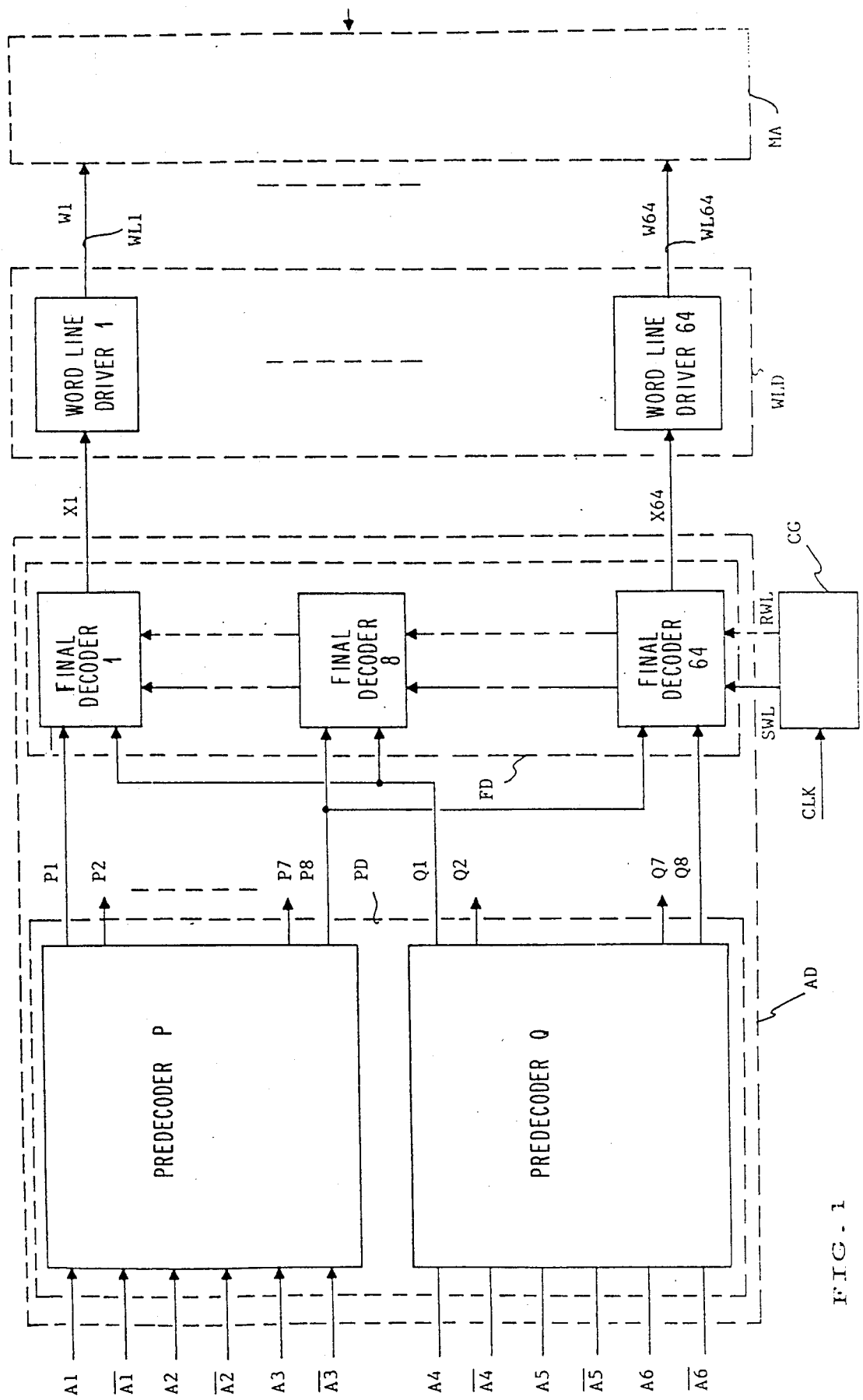
FIG. 1 is a block diagram showing the general architecture of the two stage address decoder circuit of the present invention.

Referring now to FIG. 1 there is shown a block diagram illustrating the general architecture of the address decode scheme in order to provide a 1/64 decode signal to a static random access memory device (SRAM). The two stage address decoder circuit AD is comprised of two main functional blocks. A predecoder block referenced PD, which is itself comprised of two predecoder circuits PDP and PDQ, operates as a first stage/section. Input address signals A1 to A3 (and inverted signals) are applied to the address lines of predecoder PDP. Predecoded output signals P1 to P8 are available at the outputs of the PDP circuit. Similar construction applies to predecoder circuit PDQ respectively with input address signals A4 to A6 and predecoded output signals Q1 to Q8. Predecoder circuits PDQ and PDQ are identical and each decode one out of 3 true/complement input address signals. As known, a three bit address signal can be decoded to provide eight different output signals.

Two stage decoder circuit AD also includes a final decoder block FD to operate as the second stage and comprises 64 final decoder circuits referenced FD1 through FD64. They are driven by the combinational set of predecoded output signals generated through the predecoding stages. By way of example, predecoded output signals P1 and Q1 are applied to FD1, while predecoded output signals P8 and Q8 are applied to FD64. The output of each FD circuit is connected to a word line driver which is designed and constructed depending on whether the SRAM technology is pure bipolar or BICMOS. Each final decoder e.g. FD1 supplies a decoded output signal, e.g. X, to a word line driver circuit, e.g. WLD1. All the 64 word line drivers WLD1 to WLD64 form word line driver block WLD. Word line drivers, e.g. WLDl, provide word line output signals, e.g. W1 on the word lines, e.g. WL1. The latter are connected in a standard fashion (not shown) which is readily known and available to one skilled in the art of memory cell arrays MA.

It is to be noted that for this modular organization, a single circuit AD including several predecoder circuits and different word line driver blocks may service a plurality (k) of memory arrays (called subarrays).

According to a key feature of the present invention, the predecoders are built with a differential cascode (DCCS) tree associated with an improved current source. The final decoder circuits are each comprised of an OR gate loaded by a switched current source.

To ensure adequate timing and power saving, final decoder circuits FD1 to FD64 operate under the control of a clock generator CG which provides control signals from a clock signal CLK. The use of this CG circuit is recommended for optimized operation of the address decoder AD in order to save power consumption. This generator delivers a Set Word Line (SWL) control signal when the main clock signal CLK is activated and in practice is a single shot circuit.

Figure 2:
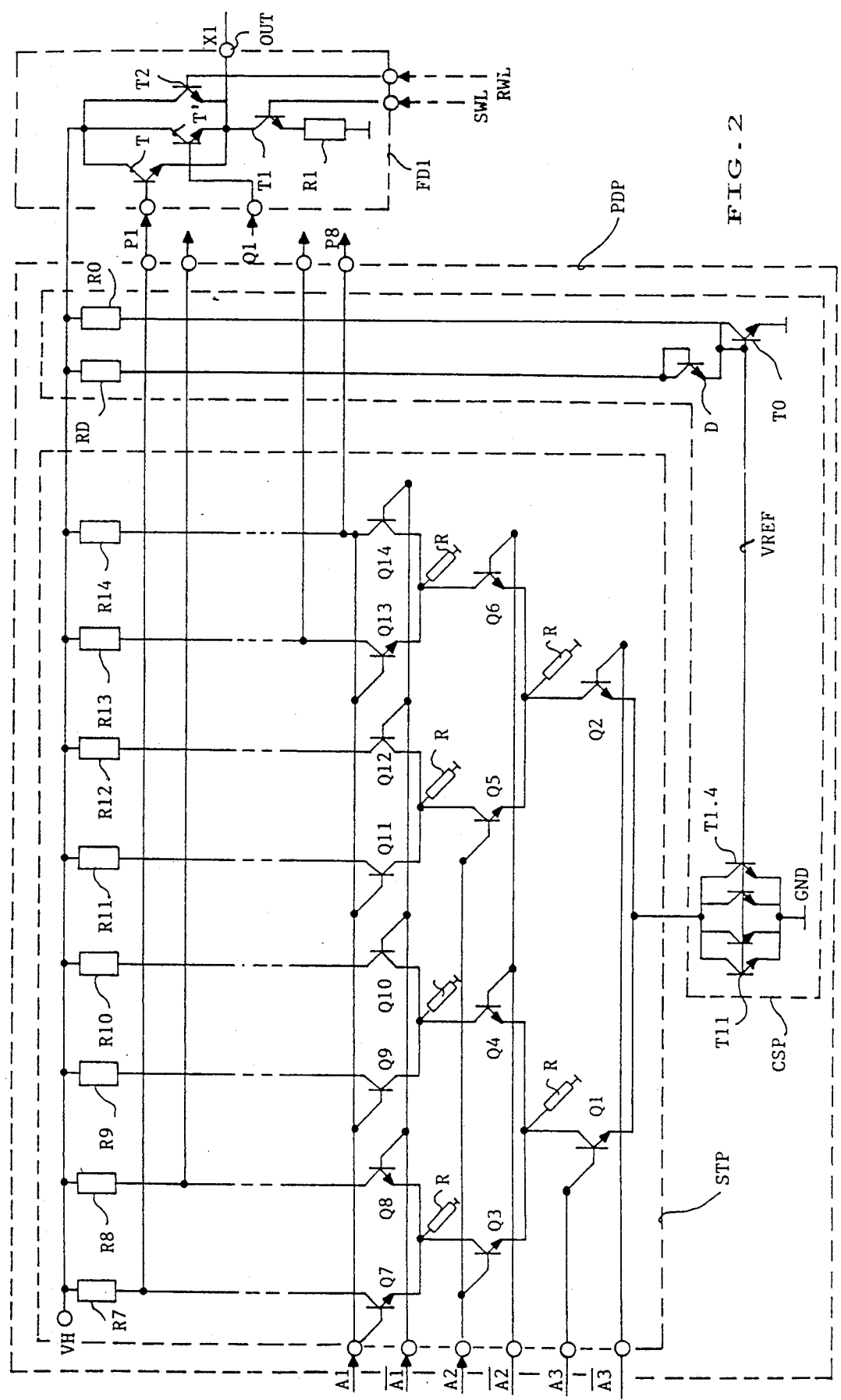
FIG. 2 is a circuit diagram showing a typical embodiment of the two stage address decoder circuit including a DCCS tree with an improved current source in the predecoding stage and a plurality of switched OR gates in the final stage.

Referring now to FIG. 2, there is shown in detail a "typical" embodiment of one predecoder circuit, e.g. PDP and one final decoder circuit, e.g. FD1 of the address decoder AD of the present invention.

As previously disclosed, predecoder circuit PDP is used for decoding three binary valued input signals A1 to A3 into one of eight binary valued output signals P1 to P8. The predecoder circuit PDP comprises one logical DCCS tree referenced STP, and one current source referenced CSP connected to the tree. The tree consists of a plurality of cells where each cell comprises a pair of transistors. The cells are arranged in levels corresponding to the number of address signals, and where each level is associated with a different one of the address signals. Level 1, comprising one cell (Q1, Q2), is associated with address signal A3. Level 2 is associated with address signal A2 and includes two cells (Q3, Q4; Q5, Q6). Level 3 is associated with address signal A1 and comprises four cells (Q7, Q8; Q9, Q10; Q11, Q12; Q13, Q14).

The collectors of output transistors at level 3 are loaded by respective resistors R7, to R14 connected to a first supply voltage VH, are all of the same value. The address signals supplied to each cell are differential (true/complement) input address signals. Each cell comprises a pair of switching elements shown as transistors, whose emitters are coupled together and whose collectors provide output signals of the cell which are connected to the following level as input signals. The differential address signals are applied to the base of the transistors of the cells. Each transistor functions as a switch to establish a current path from a current source in level 1 or a cell to another cell in the next level. The tree structure, therefore, has the capability of establishing one of eight unique current paths depending upon the binary value of the address signals i.e. bits: A1, A2 and A3. Each unique current path corresponds to one of the eight possible permutations which can be established for three binary value input signals. When selected, an output transistor is turned on and when the corresponding predecoded output signal is at a down or low level, the 7 remaining output transistors are cut off and the corresponding predecoded output signal is at VH (all of which is well known to those skilled in the art).

The current source CSP is formed by a single transistor connected between the common emitters of Q1 and Q2 and a second supply voltage GND Its base is connected to a reference voltage VREF. To improve speed, it is essential to keep output transistors at level 3 out of saturation. In lieu of using a single transistor it is split into four elementary transistors T1.1 through T1.4, the base electrodes of which are tied together and connected to a reference voltage VREF supplied by an antisaturation circuit operating in a current mirror mode. The antisaturation circuit includes transistor T0 mounted in a diode configuration since its base-collector junction is shorted, and loaded by resistor R0 connected to VH. Another load resistor RD in series with a diode D is connected in parallel with resistor R0.

As a result, the STP tree shown in FIG. 2 is basically a 3 level DCCS circuit for pre-decoding the 3 address signals applied to the address lines. For that purpose the address signals are true and complement signals generated on m=3 different referenced levels. As an example, these complement (or inverted) address signals can be generated through a standard differential amplifier (not shown), comprised of two bipolar transistors having an emitter coupled configuration. The collectors of these transistors are connected through load resistors to a supply voltage Vref(m).

The address signal is applied to the base electrode of one transistor, while the other base electrode is connected to a reference voltage Vref. The characteristic voltage swing of the Ai and $\overline{Ai}$. (Address i true and Address i complement with i=1 to m) is not greater than 300 mV. This very small differential signal helps to achieve fast operation with a comfortable margin in noise immunity. It is well known that differential ECL type of circuits can be operated with small swing input signals while maintaining a sufficient DC noise tolerance. These 3 pairs of address signals A1 to Am (m=1 to 3) are referenced with respect to GND at 3 different values.

The value at which these signals are referenced is determined by address signals A3. They must be as low as possible in order to allow the largest swing at the collectors of the output transistors, keeping in mind that the current source transistors (T1.1 to T1.4) have to operate sufficiently far from saturation in order to prevent speed failure and low level output 1.2 V. Accordingly, the up or high level of A3/$\overline{A3}$ is 1.2 V while the down or low level is 0.9v (1.2 V−0.3 V=0.9V). Therefore 300 mV is the standard voltage swing for Ai/$\overline{Ai}$. This value of 1.2 V for Vref(3) provides a voltage of 0.4 V across transistors T1.1-T1.4, which is sufficient to ensure a correct current mirroring of transistor T0. Each of the other reference voltages Vref(2), Vref(1) is successively determined with a similar constant voltage increment. The latter must be as low as possible, to maximize the swing capability, but not too small so as to cause saturation of transistors, which in turn, could result in consequent speed degradation and failure in operation as mentioned.

For these reasons, the incremental voltage value between the different address signals in the DCCS tree has been chosen to be around 300 mv. The Vcb of any transistor in the DCCS tree is given by Vref(k)−Vref(k−1)−Vbe, with k=1 to m. The 300 mV of voltage incremental between the Vref(m) allows an automatic clamp of about 0.5 V across the collector-base junction of any transistor in the tree, which keeps all transistors our of saturation.

With semiconductor technologies known to date and the continuous trend towards reduced power supplies (e.g. VH=3.5V), the level number m, which also corresponds to the number of address signals to be decoded, may be such that m≦5.

High value resistors R (in the range of 10 k ohms) are provided at all the intermediate common emitter nodes in the DCCS tree to prevent these nodes from being charged to a high value voltage through different leakage paths. Otherwise, this would lead to performance unpredictability, particularly during the long periods of time the SRAM is not addressed.

The design of the current source can be made differently depending on the type of cell that is used in the memory cell array. If the technology considered is a BICMOS one, the mirrored current in transistor T0 is such that the predecoded output signals on the 8 collectors of the output transistors at the end of the DCCS tree will be driven with respect to GND at the down or low level. The respective high voltage on said signals will always follow VH. The goal of current source CSP is to drive the collectors of the output transistors (Q7 through Q14) as low as possible in order to be able to drive a BICMOS- driver under the best conditions. It is well known that a BICMOS or a CMOS driver needs a large voltage swing to operate efficiently (overdrive Vgs above the threshold voltage).

Accordingly, it is possible to adjust the various resistors: RD, R0 and R7-R14, in order to get the desired low voltage at the collectors of the output transistors of the DCCS tree (this voltage being referenced to GND). If we assume that R0=k×RD and RP (P=7 through 14)=k'RD, we can compute a given predecoded output signal, e.g. P1:

$$P1 = VH − k'RD[VH − Vbe(Q7))/kRD + (VH − Vbe(Q7) − Vbe(Q8))/RD]$$

$$P1 = VH − k'RD[(VH(1+k)) − Vbe(1+2k))/kRD]$$

If we want to have P1 independent from VH variations and to adjust P1 at a low logic level to 1.7 Vbe; we must have:

$$k/k'(1+k) = 1 \text{ and } 1.7 \ Vbe = k'(1+2k) \ Vbe \ / \ k$$

Solving this system of equations, we find k=1.5 and k'0.64.

It is therefore possible to adjust the parameters of k and k' to have 1.7 Vbe at the collectors of the output transistors of the DCCS tree (k=1.5, k'=0.64). RD can be seen as a normalized value which determines the speed of the predecoder circuit. As a result, it is very easy to increase or to slow down the speed of the DCCS tree, since its performance is mainly dependant on the value of RD.

Generally, any FD circuit, e.g. FD1, may basically be considered a switchable OR gate built with emitter dot followers. The OR gate includes transistors T and T' connected in parallel between VH and a common emitter or OUT node at the same potential as the OUT terminal. This OUT node is connected to a switchable current source comprising transistor T1 and resistor R1 connected to GND. Signal SWL is applied at the base of transistor T1. Depending on the type of the world line driver circuit used, a single control signal SWL may be sufficient to activate the FD circuits, for example, if they are of the self power-off type. With standard word line drivers, a second control signal RWL (Reset Word Line) has been found to be necessary. Control signal RWL is generated by the clock generating circuit. In this case, a third transistor T2 is mounted in parallel with transistors T and T', its base being driven by control signal RWL.

Increased flexibility can be given to the OR gate if so desired. For example, an additional transistor T" (not shown) may be added in parallel with transistors T and T' in the OR gate, if a supplemental predecoder/current source PDR/CSR (not shown) is desired in order to increase the number of decoded output signal/lines. Therefore, SWL and RWL control signals are respectively used to set a decoded word line within the cell array during a predetermined time window, and to turn off the 64 FD circuits. The word line that is selected corresponds to the set of collector outputs that are low. The address is kept stable during the READ operation, the end of which is conditioned by the RWL control signal.

Figure 3:
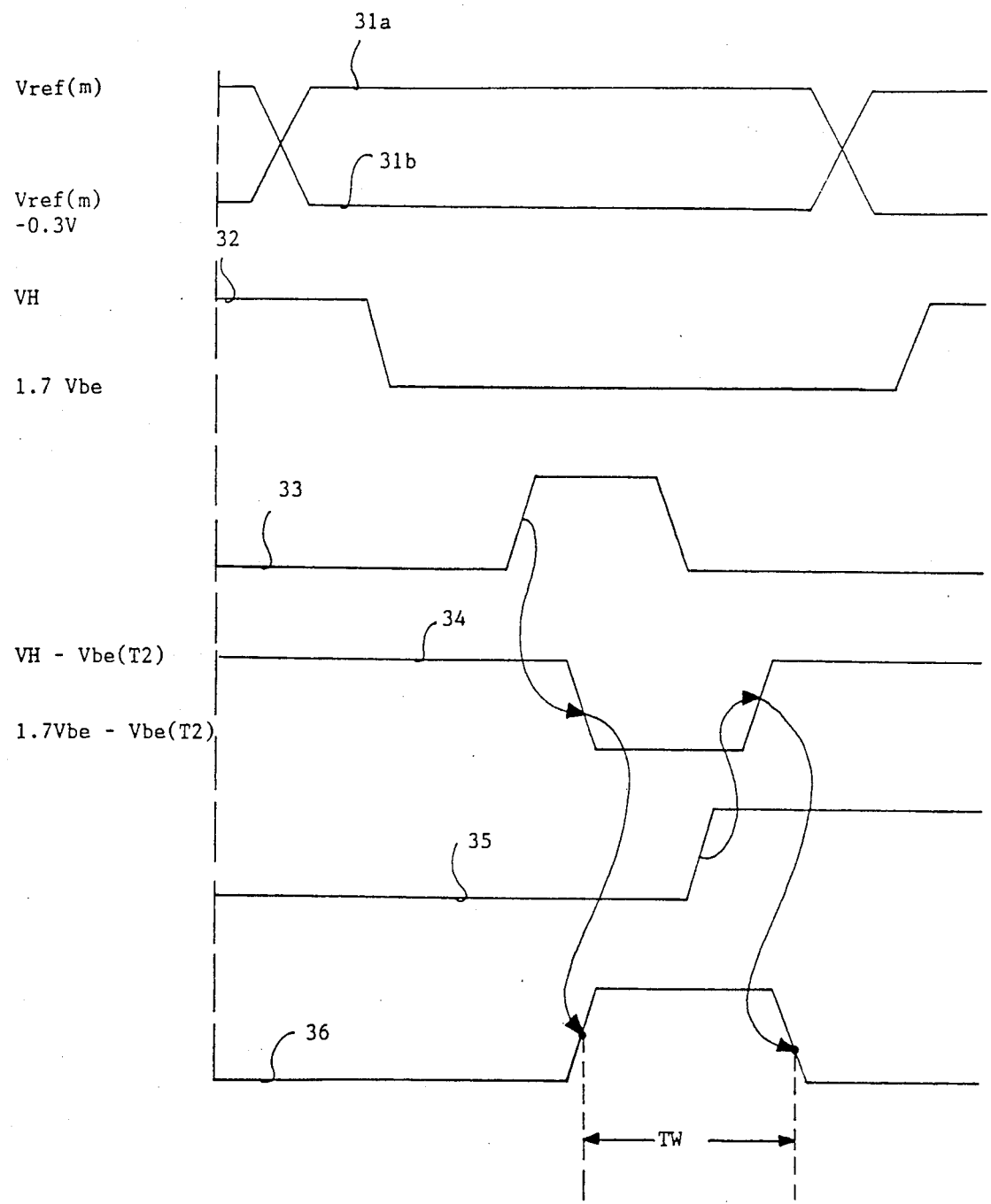
FIG. 3 illustrates typical waveforms in the data path of the two stage address decoder circuit of the present invention.

FIG. 3 shows typical waveforms in the data path of the two stage address decoder circuit of the present invention. Curves 31a and 31b show the address input signals An $\overline{An}$ and illustrate the voltage difference of 0.3 V used to distinguish the true/complement signals. Curve 32 shows one typical predecoded output signal P1 to P8 or Q1 to Q8. Curve 33 is the SWL control signal. This curve is a calibrated pulse related to the total memory cycle with the width determining the power dissipation of the final decoder circuits. Curve 34 shows a typical decoded output signal X1 to X64. Curve 35 is the RWL control signal. This curve is also a calibrated pulse, but its width is not critical to the overall circuit operation. The rising edge of this signal is used to restore the output signals to high voltage: VH-Vbe (T2). A typical word line output signal W1 to W64 is illustrated by curve 36. TW represents the duration of the memory array selection window. This window is determined by the rising transitions of SWL and RWL. It is important to note that the minimum SWL pulse width has to be adjusted in order to have a correct voltage position for decoded output signals X1 to X64.

In summary, the operation of address decoder operation AD is as follows. The address signals propagate through the DCCS tree and finally only 1 out of 8 collector outputs in the DCCS tree referenced STP will be at a down or low level since, a deselection in the DCCS tree corresponds to a high voltage value which is given by the power supply VH. The clock generator CG generates the SWL control signal, so that current flows in transistors T1.1 signal, so that current flows in transistors T1.1 through T1.4. The decoded output signal of the single FD circuit that has a low voltage on each base of transistors T1.1 through T1.4 will discharge one Vbe below the low voltage provided at the output of the DCCS. Control signal SWL can only be activated for a time period compatible with the total capacitance connected at the OUT terminal. By this it is possible to minimize power consumption in the final decoder stage. Next, the RWL control signal is applied at the base of transistor T2 and restores the OUT node to VH-Vbe(T2).

As explained above, K represents the number of partial cell arrays that can be driven (eventually in parallel). Although the value of K will impact the performance at a given power consumption the DCCS predecoder will continue to operate normally under a wide range of values for K. It is also obvious that the clock signals must be optimized differently depending on K. When K increases, the SWL and RWL control signals must necessarily be delayed.

In a more generic sense, the decoding scheme of the present invention may be extended to the use of several predecoder circuits: PDP, PDQ, PDR, . . . to decode m, m', m", address signals so that n=m+m'+m". The respective number of predecoded output signals is therefore $M=2^m$, $M'=2^{m'}$, $M''=2^{m''}$; and the number of final decoders is given by $N=2^m \times 2^{m'} \times 2^{m''}$ . . . or $N=2^{m+m'+m''}$.

For example, where n=6, m=m'=3, we obtain $N=2^{m+m'}=2^n=64$ which corresponds to the implementation shown in FIG. 2. With n=10, m=4, m'=4 and m"=2, we obtain N=1024.

Accordingly, the characteristics of the two stage address decoder of the present invention may be summarized as follows:

A low power/high speed DCCS predecoder is possible, where the performance is substantially dependent on the normalized value of resistor RD. The signal swing amplification is made in the first stage circuit so that there is no need for a specific signal conversion in front of the word line driver.

No DC power is consumed in the second stage, because the FD circuit is of the switched type. Further, it provides a means to suppress any address glitch problems. As a result of combining an OR gate with a switched current source activated by a control signal SWL of the pulse type, and which minimizes power consumption.

Additionally, different configurations are easily realizable when the number of predecoder circuits and/or the number of levels increases.

Also, it is possible to drive either an ECL or a BiCMOS word line driver. In the field of BiCMOS application the DCCS tree provides a signal which is referenced to VH and GND, while in the field of ECL application, the DCCS tree output signal can be referenced with respect to VH only. The Vref(m) voltage allows for the adjustment of the operating point in the DCCS over a wide range.

Although the above description was made with reference to an address decoder circuit comprised of two 3 level DCCS predecoder circuits with sixty-four FD circuits, it is to be understood that the present invention is not limited to, but has a wider range of applications according to the speed/power target that must be reached for the whole memory.

Further, this invention is widely applicable, not only to a semiconductor memory such as a dynamic RAM, a static RAM or any of various ROMs, but also to various semiconductor integrated circuits each comprising a decoder circuit which receives digital address signals composed of a plurality of (n) bits and forms $2^n$ predecoded output signals. Finally, although the invention was described with reference to a word address decoder, it is also applicable to a column address decoder.

We claim:

1. A two stage address decoder circuit for decoding a plurality of bits of n input address signals and inverted address signals, comprising:

a first stage biased between a first supply voltage and a second supply voltage, said first stage including at least two precoder circuits, each of which consists of at least one multilevel Differential Cascode Current Switch tree and a constant current source, each precoder respectively decoding first bit groups of an address input signal and generating respective sound bit groups of precoded signals;

a second stage including a plurality of N final decoder circuit driven by at least one pair of said bit groups of said precoded signals and providing N final decoded output signals at output terminals thereat; and clock generating circuit means for generating at least one first control signal in response thereto, to dynamically activate said N final decoder circuits, said N final decoder circuits each consisting of an OR gate activated by a switched circuit which is triggered under the control of said first control signal.

2. The two stage address decoder circuit of claim 1 wherein said N final decoder circuits each consist of at least two bipolar transistors connected in parallel wherein the base is driven by one of said precoder output signals, the respective collectors are connected to a first supply voltage, and the respective emitters are all coupled together thereby forming a common node at an output terminal lead thereat, said output terminal lead connected to a switched current source emitter follower circuit.

3. The two stage address decoder circuit of claim 2 wherein said switched current source emitter follower circuit comprises a bipolar transistor connected in series with a resistor tied to a second supply voltage, the base of said bipolar transistor receiving said first control signal and having its collector connected to said common node.

4. The two stage address decoder circuit of claim 3 wherein an additional transistor is connected in parallel with said at least two bipolar transistors, the base of which is driven by a second control signal.

5. The two stage address decoder circuit of claim 4 wherein said differential cascode switch tree is comprised of a plurality of cells, each said cell being comprised of at least a pair of transistors with coupled emitters, the collectors of each said pair of transistors for the most significant of the n input address bits are loaded by respective load resistors connected to said first supply voltage.

6. The two stage address decoder circuit of claim 5 wherein each said constant current source is comprised of a plurality of bipolar transistors connected in parallel and having their common emitter electrode connected to said second supply voltage and their common base connected to a voltage reference generator consisting of a current mirror circuit.

7. The two stage address decoder circuit of claim 6 wherein said current mirror circuit consists of a transistor in a diode configuration and loaded in a first branch by a first resistor and in a second branch by a second resistor connected in series with a diode.

8. The two stage address decoder circuit of claim 7 wherein any said load resistor is equal to: k' multiplied by the value of said second resistor in said second branch, and the value of said first resistor in said first branch is equal to k multiplied by the value of said second resistor in said second branch, wherein the parameters k and k' are such that the potential of said collector of said at least pair of transistor for the most significant input address bit is clamped to 1.7 $V_{be}$.

9. The two stage address decoder circuit of claim 8 wherein respective values of parameters k and k' are approximately 1.5 and 0.64 respectively.

10. The two stage address decoder circuit of claim 5 wherein each remaining pair of said coupled emitters of the differential cascode current switch tree are connected to said second supply voltage through a resistor.

11. The two stage address decoder circuit of claim 1 wherein said differential cascode switch tree is comprised of a plurality of cells, each said cell being comprised of at least a pair of transistors with coupled emitters, the collectors of each said pair of transistors for the most significant of the n input address bits are loaded by respective load transistors connected to said first supply voltage.

12. The two stage address decoder circuit of claim 5 according to claim 13 wherein each said constant current source is comprised of a plurality of bipolar transistors connected in parallel and having their common emitter electrode connected to said second supply voltage and their common base electrode connected to a voltage reference generator consisting of a current mirror circuit.

13. The two stage address decoder circuit of claim 12 wherein said current mirror circuit consists of a transistor in a diode configuration and loaded in a first branch by a first resistor and in a second branch by a second resistor connected in series with a diode.

14. The two stage address decoder circuit of claim 13 wherein any said load resistor is equal to k' multiplied by the value of said second resistor in said second branch, and the value of said first resistor in said first branch is equal to k multiplied by the value of said second resistor in said second branch, wherein the parameters k and k' are such that the potential of said collector of said at least pair of transistors for the most significant n input address bit is clamped to 1.7 $V_{be}$.

15. The two stage address decoder circuit of claim 14 wherein respective values of parameters k and k' are approximately 1.05 and 0.64 respectively.

16. The two stage address decoder circuit of claim 11 wherein each remaining pair of said coupled emitters of the differential cascode current switch tree are connected to said second supply voltage through a resistor.

* * * * *